(12) United States Patent
Chen

(10) Patent No.: US 7,898,364 B2
(45) Date of Patent: Mar. 1, 2011

(54) SYSTEM AND METHOD FOR USING MEMS FILTER BANK

(75) Inventor: Ting-Yin Chen, Santa Clara, CA (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 196 days.

(21) Appl. No.: 12/314,495

(22) Filed: Dec. 11, 2008

(65) Prior Publication Data

US 2009/0237179 A1 Sep. 24, 2009

Related U.S. Application Data

(60) Provisional application No. 60/996,937, filed on Dec. 11, 2007.

(51) Int. Cl.
*H03H 9/46* (2006.01)
*H03H 9/70* (2006.01)

(52) U.S. Cl. ...... 333/186; 333/133; 333/200; 455/170.1; 455/296; 455/307

(58) Field of Classification Search .................. 333/133, 333/186, 197, 199, 200; 455/150.1, 170.1, 455/179.1, 187.1, 192.1, 296, 307
See application file for complete search history.

(56) References Cited

U.S. PATENT DOCUMENTS

| | | | |
|---|---|---|---|
| 4,100,506 | A | 7/1978 | Ernyei |
| 5,025,346 | A | 6/1991 | Tang et al. |
| 5,839,062 | A | 11/1998 | Nguyen et al. |
| 6,429,755 | B2 | 8/2002 | Speidell et al. |
| 6,539,253 | B2 | 3/2003 | Thompson et al. |
| 6,566,786 | B2 | 5/2003 | Nguyen |
| 6,577,040 | B2 | 6/2003 | Nguyen |
| 6,600,252 | B2 | 7/2003 | Nguyen |
| 6,711,216 | B2 | 3/2004 | Hannah |
| 7,098,757 | B2 | 8/2006 | Avazi et al. |
| 7,187,735 | B2 | 3/2007 | Kent, III et al. |
| 2004/0218686 | A1 | 11/2004 | Pastemak et al. |

(Continued)

FOREIGN PATENT DOCUMENTS

EP 1 383 236 A1 * 1/2004

OTHER PUBLICATIONS

Young, R.M., et al., "Low-Loss Bandpass RF Filter Using MEMS Capacitance Switches to Achieve a One-Octave Tuning Range and Independently Variable Bandwidth", Microwave Symposium Digest, IEEE MTT-S International, vol. 3, Iss. 8-13, Jun. 2003, pp. 1781-1784.

(Continued)

*Primary Examiner* — Barbara Summons
(74) *Attorney, Agent, or Firm* — Steptoe & Johnson LLP

(57) ABSTRACT

A method and apparatus for recovering at least one signal of interest are provided. The method includes receiving an overall signal, the overall signal including the at least one signal of interest and a plurality of other signals, identifying at least one of the strongest components of the plurality of other signals, attenuating, using at least one MEMS resonator, any of the components identified by the identifying, wherein the overall signal will be modified to include the at least one signal of interest, attenuated versions of the components identified by the identifying, and the remaining portions of the plurality of other signals that were not subject to the attenuating, and recovering, after the attenuating, the at least one signal of interest.

26 Claims, 13 Drawing Sheets

U.S. PATENT DOCUMENTS

| | | |
|---|---|---|
| 2006/0057959 A1 | 3/2006 | Vacanti et al. |
| 2007/0042802 A1 | 2/2007 | Park et al. |
| 2007/0081578 A1 | 4/2007 | Fudge et al. |
| 2007/0081611 A1 | 4/2007 | Fudge et al. |
| 2007/0207761 A1 | 9/2007 | Laberge et al. |
| 2008/0144735 A1* | 6/2008 | Gillette et al. ............... 375/296 |

OTHER PUBLICATIONS

International Search Report and Written Opinion, International App. No. PCT/US2008/013575, mailed Jul. 7, 2009.

* cited by examiner

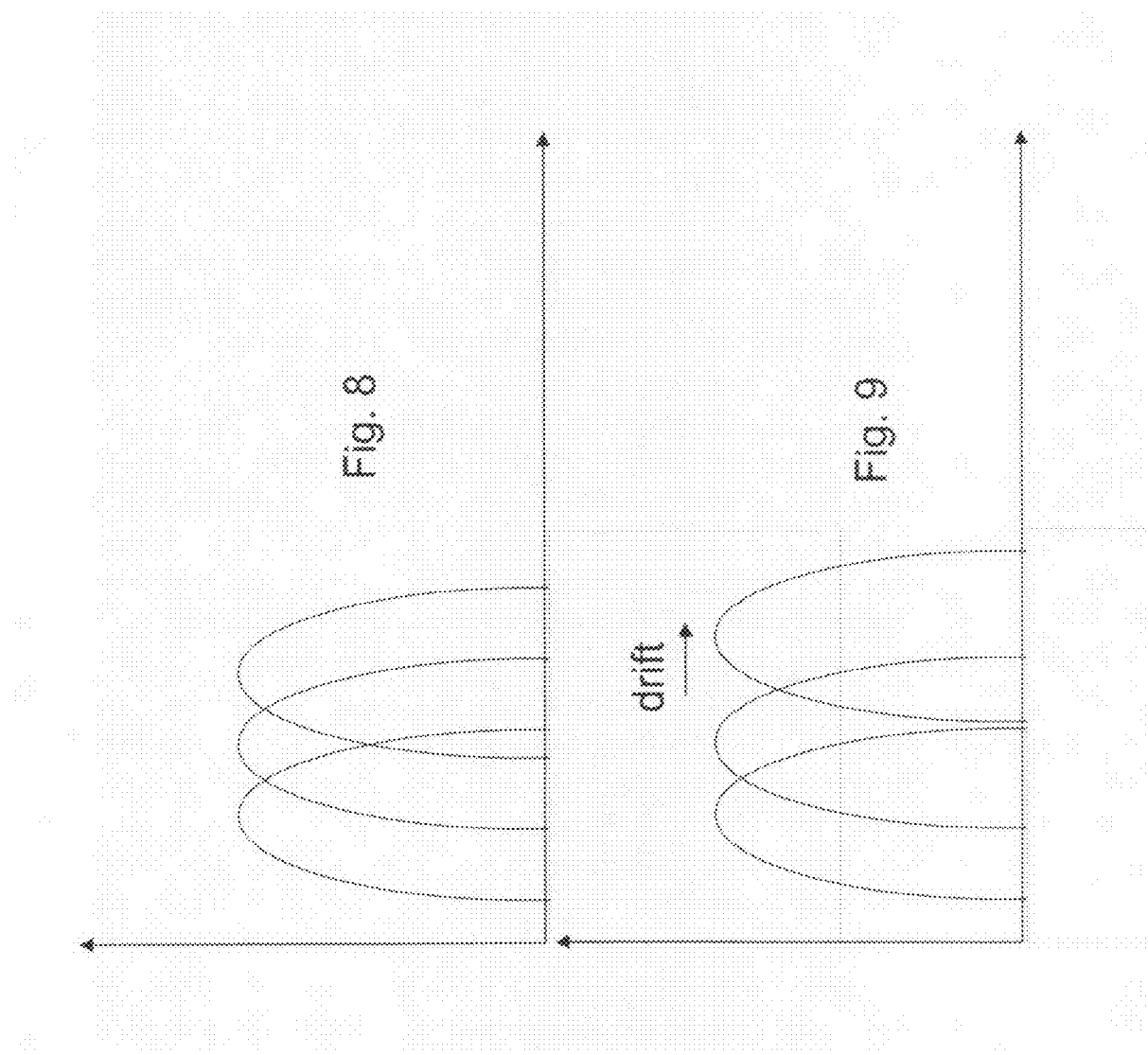

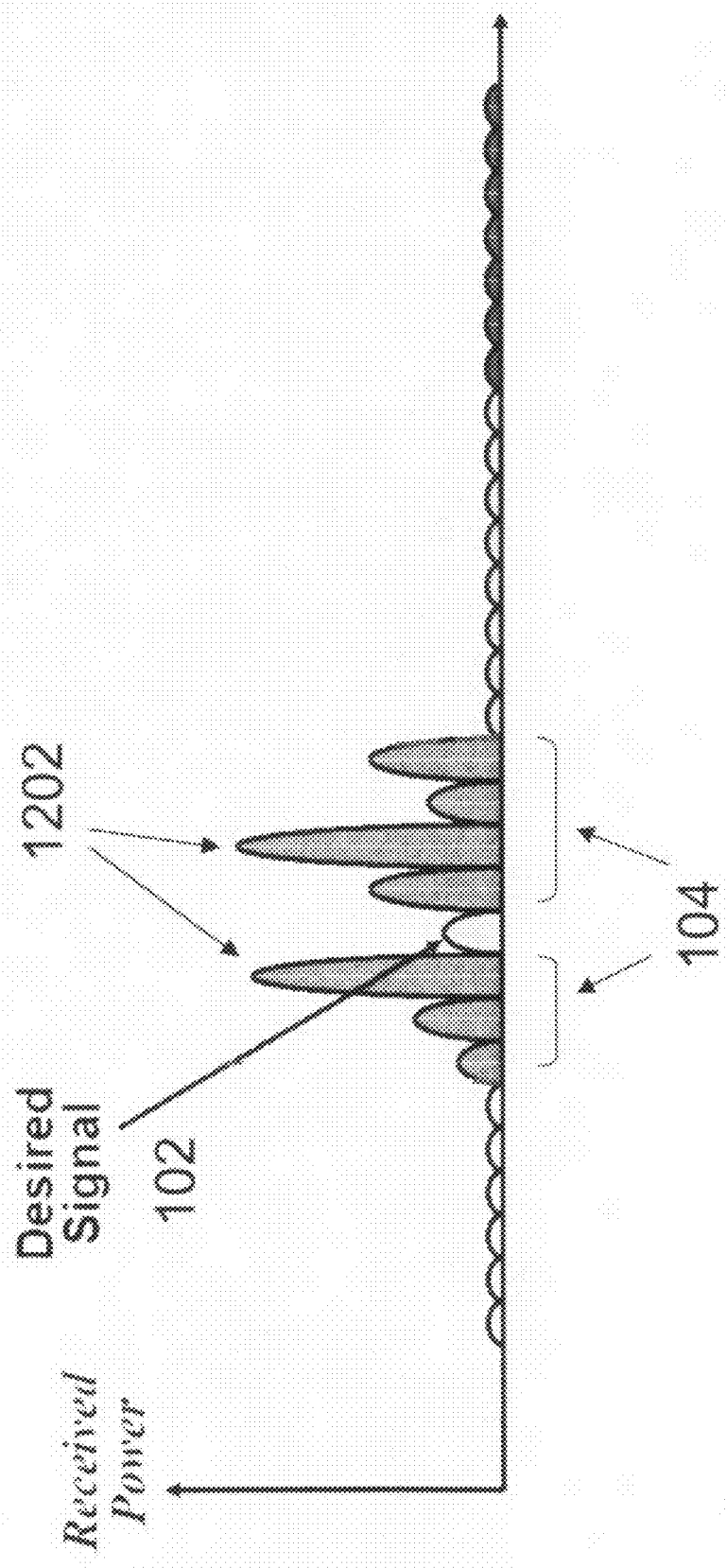

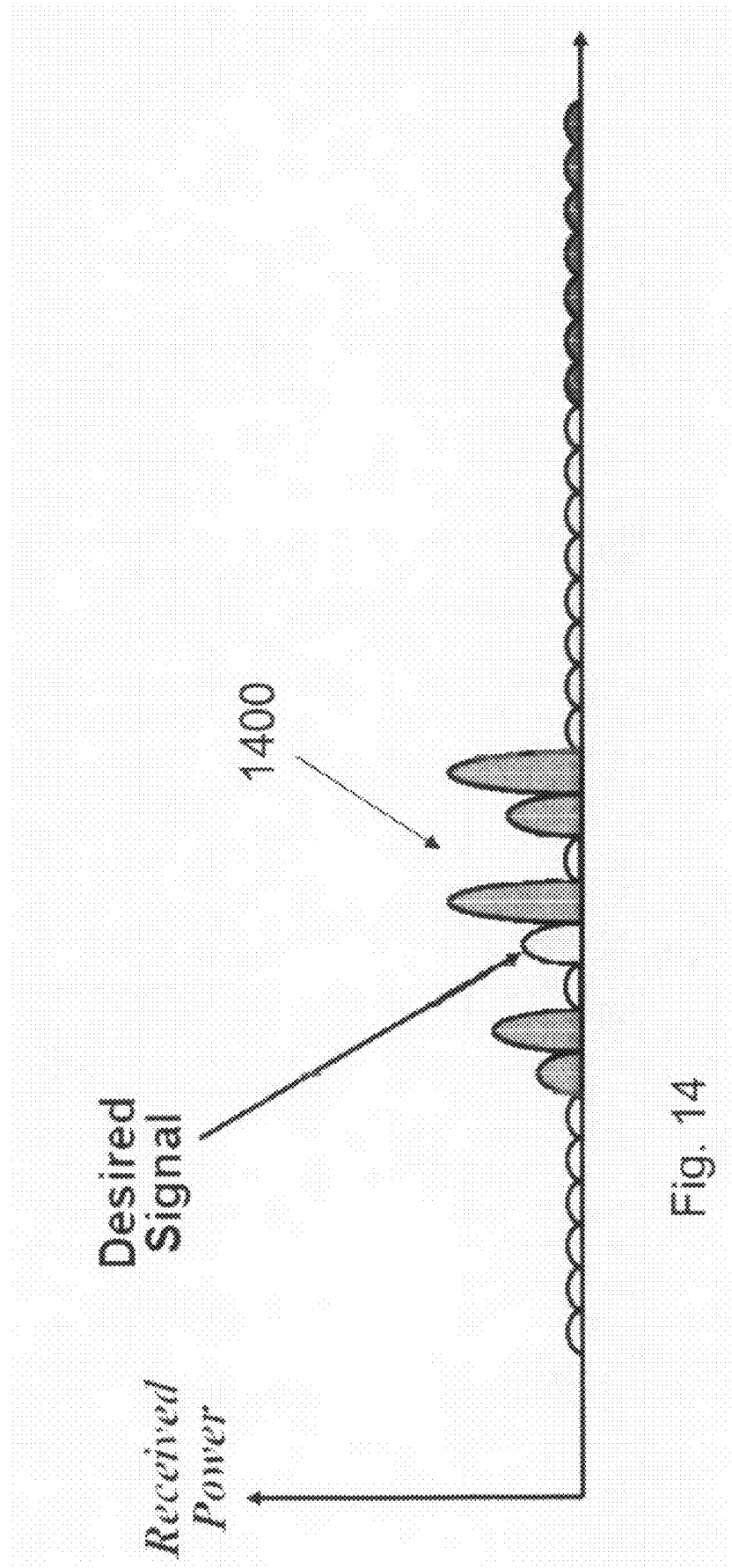

SYSTEM AND METHOD FOR USING MEMS FILTER BANK

CROSS REFERENCE TO RELATED APPLICATIONS

The instant application claims priority to U.S. Provisional Application 60/996,937 filed on Dec. 11, 2007, which is incorporated by reference herein in its entirety.

BACKGROUND OF THE INVENTION

1. Field of the Invention

The present invention relates to reducing the presence of interference with a desired signal. More specifically, the present invention relates to the use of micro-electromechanical systems ("MEMS") filters to reduce the presence of interfering signals in the same frequency range of desired signals.

2. Discussion of Background Information

Antennas often receive radio frequency transmissions that include both a desired signal and substantial undesirable interference in adjacent frequencies. Since signal strength and amplitude is directly related to the distance of the signal source to the antenna, the desired signal (which typically emanates from a distant signal source) may be much weaker than interference emanating locally relative to the antenna. FIG. 1 shows an example of how a signal 100 includes desired signal 102 intermixed with much stronger interference signals 104. The challenge is to recover a desired weak signal that is proximate to stronger interference signals. The receiver front end must be able to accommodate the strong signal without saturation and have enough dynamic range to recover the weak desired signal.

It is therefore desirable to initially pass the received signal through a front end filter before processing the received signal to remove as much interference as possible. However, such efforts have not proven effective for high frequency signals, as the bandwidth of the signal (typically on the order of 10,000 Hz) is much larger than the bandwidth of typical band pass filters (typically on the order of 500 Hz). FIG. 2 shows an example of the signals from FIG. 1 being filtered according to this method. While the filter is effective to remove out of band interferers, it has no effect on the interferers within the bandwidth of the filter. Such filters may also prove ineffective if there are any desirable signals that fall outside of the range of the filter.

Recently efforts have been made to use MEMS resonators as band pass filters limited to the signal(s) of interest. FIG. 3 shows an example of such a MEMS resonator, and FIG. 4 shown an example of two MEMS resonators connected to form a MEMS filter. In theory, the bandwidth of such a MEMS filter can be made consistent with the bandwidth of the desired signal, so that the MEMS filter could filter out all interferences other than the desired signal. Referring now to FIG. 5, a series of such filters could be theoretically set for different adjacent bandwidths to cover the entire frequency band of interest; depending on the frequency of the signals of interest, individual filters could be turned ON to only allow those signals of interest 102 to pass while all other signals are filtered out.

The theory has not proven effective in practice because of a lack of stability in MEMS resonators. The methodology shown in FIG. 5 requires that each MEMS filter maintain its position on the frequency spectrum. However, the specific resonance frequency of a MEMS filter is also highly dependent on the shape of the components, which is subject to variances in manufacturing accuracy and tolerance during initial fabrication. Even if perfectly manufactured, the resonance frequency of each filter (i.e., the range of frequency between the lower cutoff frequency and the upper cutoff frequency of the filter) is expected to shift due to physical changes in the geometry of the resonator due to changes in external temperature and aging. As the resonance frequencies of individual filters diverge, the various bandwidths will either begin to overlap or expose gaps therebetween. This will in turn allow for additional interferences to pass through, as well as possibly filtering out the desirable signal.

Another drawback of the use of MEMS filters in this manner is that the filter processes the desired signal. The filter must therefore be highly linear as not to distort the signal. This places additional requirements on the design and precision of the individual MEMS components.

Still another drawback of the use of MEMS filters in this manner is that because the signal of interest tends to be much smaller than the noise, it may be difficult to find the signal of interest if its specific frequency is not known.

SUMMARY OF THE INVENTION

It is accordingly an object of the invention to provide a methodology that overcomes various drawbacks of the prior art.

According to an embodiment of the invention, a method for recovering at least one signal of interest is provided. The method includes receiving an overall signal, the overall signal including the at least one signal of interest and a plurality of other signals, identifying at least one of the strongest components of the plurality of other signals, attenuating, using at least one MEMS resonator, any of the components identified by the identifying, wherein the overall signal will be modified to include the at least one signal of interest, attenuated versions of the components identified by the identifying, and the remaining portions of the plurality of other signals that were not subject to the attenuating, and recovering, after the attenuating, the at least one signal of interest.

The above embodiment may have various optional features. Optional steps and/or features include: determining, after the receiving, whether the at least one signal of interest is recoverable from the overall signal without requiring attenuation of at least one of the strongest components of the plurality of other signals, wherein the identifying, attenuating, and recovering are all contingent upon a negative result of the determining; augmenting the modified overall signal after the attenuating and before the recovering; wherein the at least one MEMS resonator includes a plurality of MEMS resonators, each configured to resonate at a different frequency range, the attenuating further comprising the step of resonating each individual MEMS resonator with a frequency range overlapping with the at least one of the strongest components, thereby providing a shunt to ground; wherein the at least one signal of interest is substantially unaffected and/or not subject to any filtering by the attenuating; receiving a master signal, passing the master signal through a band pass filter, wherein the overall signal is the output of the band pass filter; wherein the recovering comprises selecting the at least one signal of interest from either the overall signal or the modified overall signal; iteratively applying the identifying and attenuating to thereby produce a plurality of modified signals, the recovering comprises selecting the at least one signal of interest from one of the overall signal or the plurality of modified overall signals; and generating, in response to the identifying, control signals for the MEMS filter bank, the control signals being configured to selectively activate individual MEMS resonators that have frequency ranges that at least partially overlap with the identified strong components, the attenuating comprising resonating the individual MEMS filters under control of the control signals to shunt the strong components to ground.

According to another embodiment of the invention, a method for recovering at least one signal of interest is provided. The method includes receiving an overall signal, the overall signal including a signal of interest component and an interference component, identifying dominant portions of the interference component, processing the overall signal to produce a processed overall signal, the processing comprising attenuating the dominant portions of the interference component using a MEMS filter bank without any significant attenuation of the signal component or the non-dominant portions of the interference component, and attempting to recover the signal of interest component from the process signal.

The above embodiment may have various optional features. Optional steps and/or features include: determining, after the receiving, whether the signal of interest component is recoverable from the overall signal without requiring attenuation of the dominant portions of the plurality of the interference component, wherein the identifying, processing and attempting are all contingent upon a negative result of the determining; augmenting the processed overall signal after the processing and before the attempting; wherein the MEMS filter bank includes a plurality of MEMS resonators, each configured to resonate at a different frequency range, the processing further including resonating each individual MEMS resonator with a frequency range overlapping with the dominant portions, thereby providing a shunt to ground; wherein the signal of interest component is substantially unaffected and/or not subject to filtering by the processing; receiving a master signal, passing the master signal through a band pass filter, and wherein the overall signal is the output of the band pass filter; wherein the attempting comprises selecting the signal of interest component from either the overall signal or the processed overall signal; iteratively applying the identifying and processing to thereby produce a plurality of processed signals, the attempting including selecting the one signal of interest component from one of the overall signal or the plurality of processed overall signals; and generating, in response to the identifying, control signals for the MEMS filter bank, the controls signals being configured to selectively activate individual MEMS resonators that have frequency ranges that at least partially overlap with the identified dominant portion, the processing comprising resonating the individual MEMS filters under control of the control signals to shunt the strong components to ground.

According to yet another embodiment of the invention, an apparatus for reducing interference in an incoming signal traveling along a signal pathway is provided. The apparatus includes bank of MEMS resonators. Each of the resonators has an ON and OFF state, and an individual resonance frequency range that collectively defines a frequent range of the bank. An electrode has a first end connected to the signal path, and a body connected to each of the MEMS resonators, and each of the MEMS resonators has a pathway to ground. Each individual resonator with the bank responds to the signal as follows: when the individual resonator is ON and the signal includes a component at a frequency that falls within the individual resonance frequency range of the particular resonator, the individual resonator will resonate in response to the signal and at least partially shunt the component to ground, thereby attenuating that component of the signal with substantially no impact on portions of the signal at frequencies outside the individual frequency range; and when the individual resonator is OFF, or when the individual resonator is ON and the signal does not include a component at a frequency that falls within the individual resonance frequency range of the particular resonator, the individual resonator will have substantially no impact on the signal. The bank of MEMS resonators is configured to attenuate portions of the signal while having substantially no impact on the remainder of the signal.

The above embodiment may have carious optional features. The individual resonance frequency range of each MEMS resonator may substantially overlap with at least on other MEMS resonator. Each MEMS resonator in the bank of MEMS resonators may have a different length. A controller may be configured to analyze the signal at a point downstream of the signal pathway, determine which individual MEMS resonators within the bank to turn ON and OFF, and issue corresponding ON or OFF signals to the bank.

According to still yet another embodiment of the invention, an apparatus for reducing interference in an incoming signal traveling along a signal pathway is provide. The apparatus includes a plurality of banks MEMS resonators, and a plurality of amplifiers each located downstream of a respective bank of MEMS resonators. The output of each amplifier is connected to an available downstream one of the plurality of banks of MEMS resonators to thereby iteratively process the signal. A controller is configured to receive the signal and the output of each amplifier, and to issue control signals to individual MEMS resonators with the plurality of banks of MEMS resonators, to thereby attenuate interference components with the incoming signal. The a signal of interest will be recoverable from either the incoming signal or the output of at least one of the amplifiers.

The above embodiment may have each individual bank of MEMS resonators within the plurality of banks with various characteristics. Each individual resonators with the bank may have an ON and OFF state. Each of the individual MEMS resonators may have an individual resonance frequency range that collectively defines a frequent range of the bank. An electrode has a first end connected to the signal path, and a body connected to each of the individual MEMS resonators. Each of the individual MEMS resonators may have a pathway to ground. Each individual resonator with the bank responds to the signal as follows: when the individual resonator is ON and the signal includes a component at a frequency that falls within the individual resonance frequency range of the particular resonator, the individual resonator will resonate in response to the signal and at least partially shunt the component to ground, thereby attenuating that component of the signal with substantially no impact on portions of the signal at frequencies outside the individual frequency range, when the individual resonator is OFF, or when the individual resonator is ON and the signal does not include a component at a frequency that falls within the individual resonance frequency range of the particular resonator, the individual resonator will have substantially no impact on the signal. The bank of MEMS resonators is configured to attenuate portions of the signal while having substantially no impact on the remainder of the signal.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIG. 8 shows overlapping frequency coverage provided by the MEMS resonators;

FIG. 9 shows an embodiment of the invention;

FIG. 13 shows the signal of FIG. 2 in condition for further processing by an embodiment of the invention.

FIG. 14 shows the signal of FIG. 12 after processing by an embodiment of the invention.

DETAILED DESCRIPTION OF THE EXEMPLARY EMBODIMENT

The particulars shown herein are by way of example and for purposes of illustrative discussion of the exemplary embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
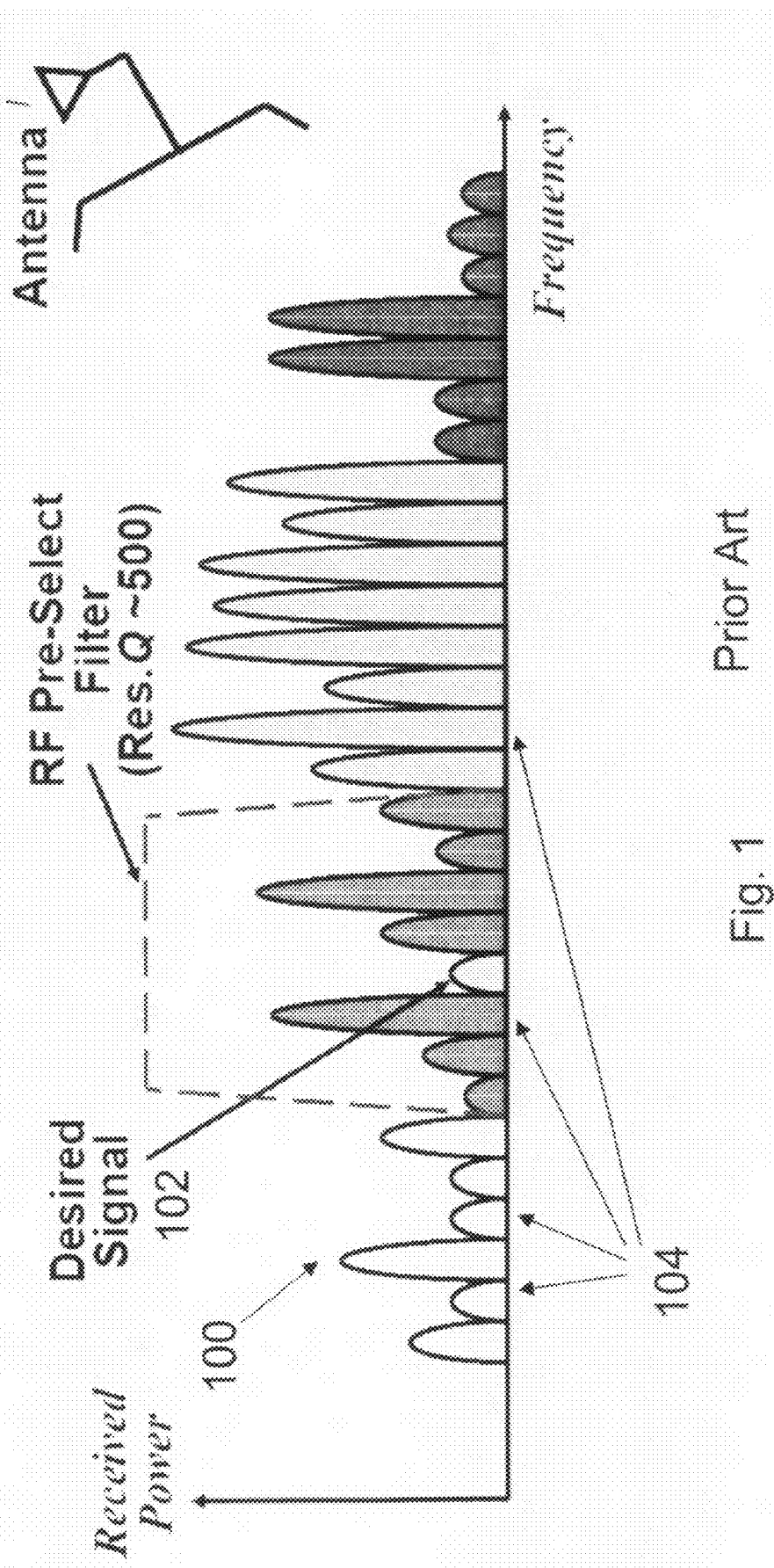
FIG. 1 illustrates an incoming signal that includes a signal of interest (or a signal component) and interference signals (of interference component(s)).

Referring again to FIG. 1, embodiments of the invention will receive a signal 100 that includes at least one signal of interest 102, as well as various noise signals 104 at different frequencies from the signal of interest 102. Except where indicated, for ease of explanation reference will be made to only a single signal of interest 102 without intending to limit the invention to such a single signal of interest 102.

At a conceptual level, embodiments of the invention utilize a bank of MEMS resonators in a band stop configuration. Each of the individual resonators will be tuned to a particular frequency, although (for reasons discussed below) accuracy and fine tuning are not critical. Collectively the bank of resonators will present a band stop filter for the entire spectrum of frequencies covered by the individual MEMS filters, thus preventing any signal from passing within that bandwidth range. Selective control over which resonators are active will thus provide filtration over large segments of the bandwidth while allowing signals at specific frequencies (e.g., the signal of interest 102) to pass through. Since the signal of interest 102 is not subject to any filtration, it does not experience any distortion as is the case in prior art MEMS band pass filters.

Figure 6:
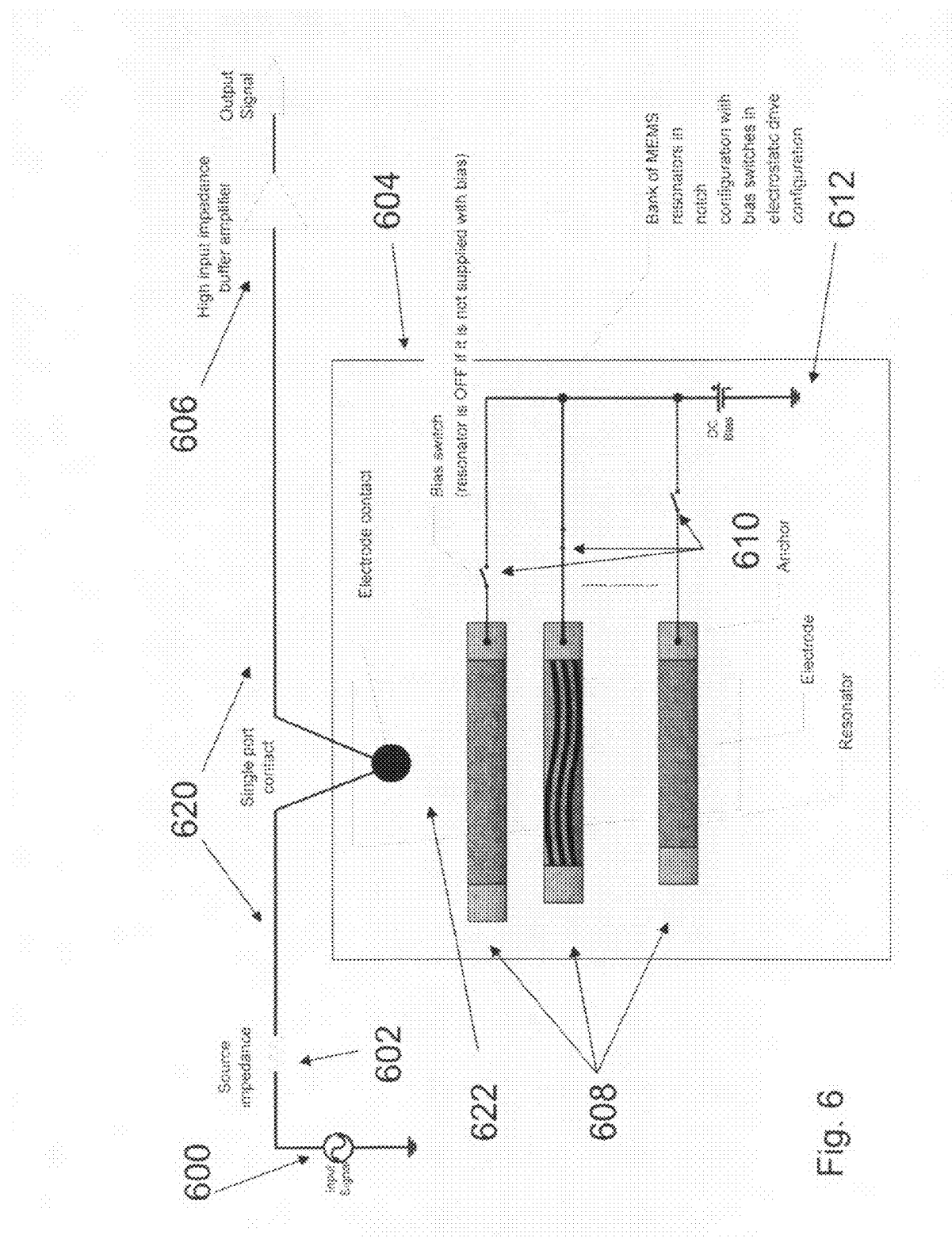
FIG. 6 shows an embodiment of the invention.
Figure 7:
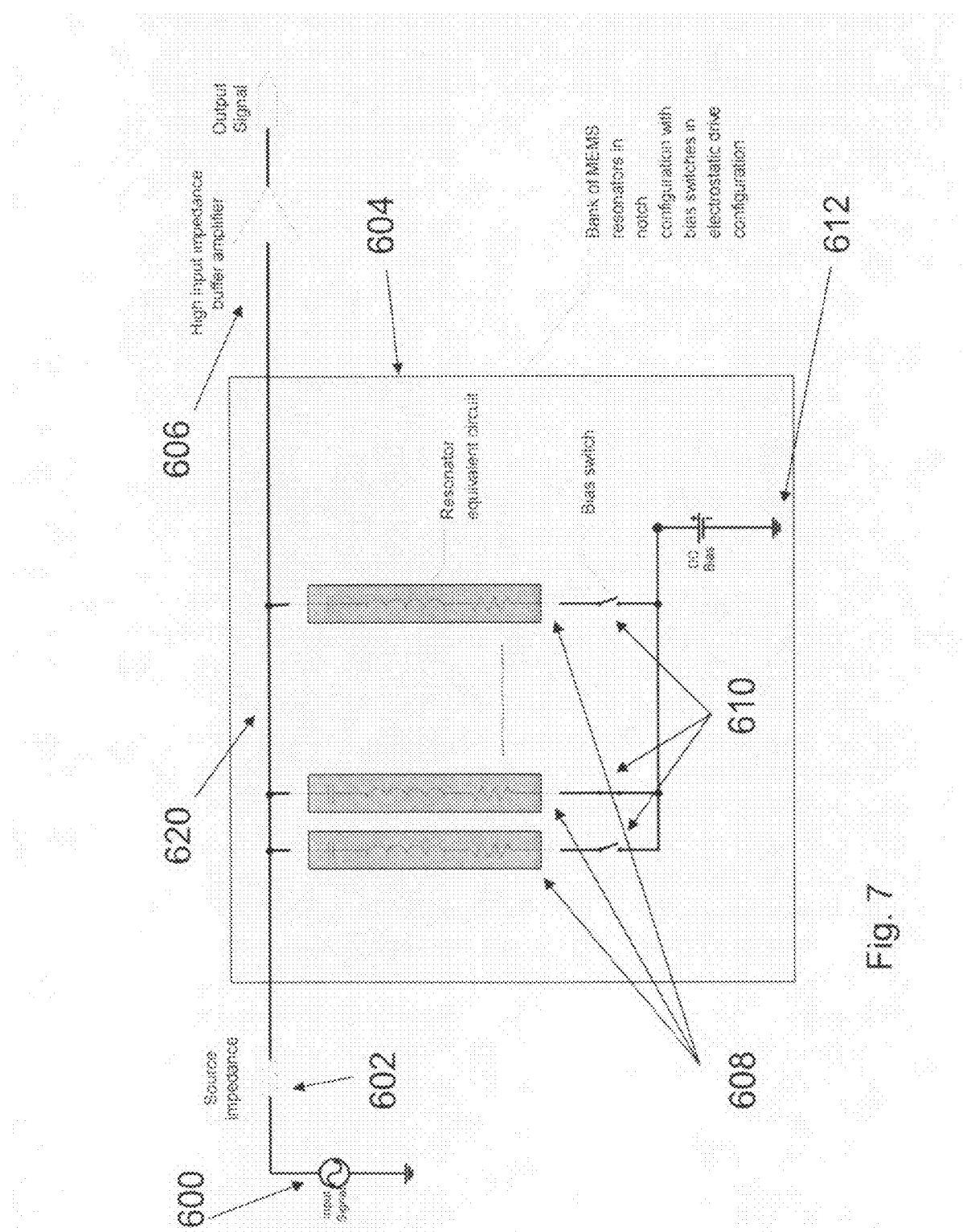
FIG. 7 shows the electrical circuit that corresponds to the structure of FIG. 6.

FIG. 6 shows an exemplary embodiment of the invention, while FIG. 7 shows its electrical schematic equivalent. A signal path 620 extends from an antenna, simulated in FIGS. 6 and 7 by an input source 600 and source impedance 602. The signal path 620 connects to an electrode 622 of a MEMS filter bank 604 before inputting to a high input impedance buffer amplifier 606 that buffers the signal before being outputted. MEMS filter bank 604 includes a plurality of individual MEMS resonators 608 aligned substantially parallel across electrode 622. FIG. 6 illustrates three (3) such resonators 608 for demonstrative purposes, but in practice the number may be considerably higher. Each MEMS resonator 608 is illustrated with different length to represent that each preferably will self-resonate at a different frequency, the exact value of which is determined by the inductance L and capacitance C of each individual MEMS resonator 608.

Figure 3:
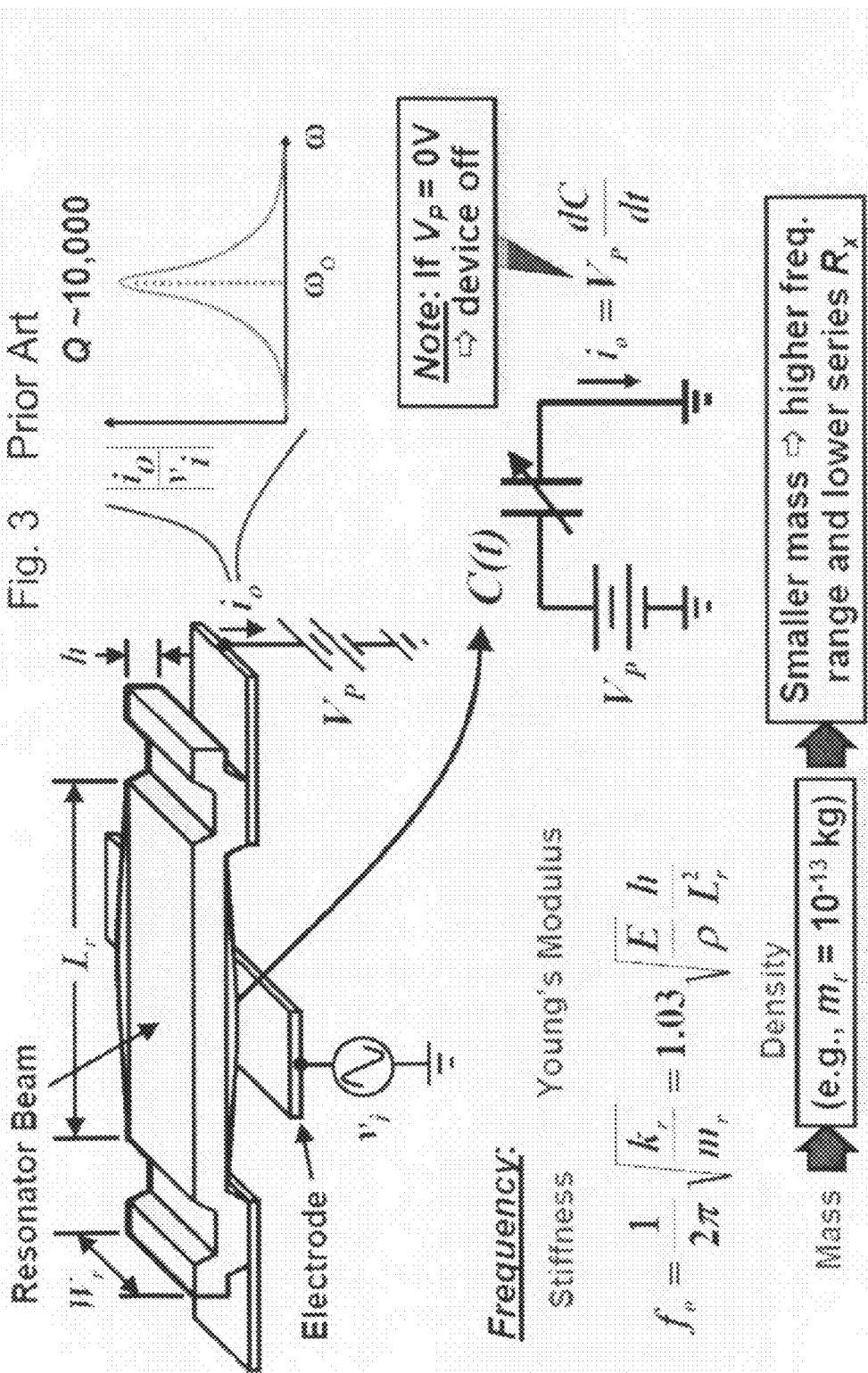
FIG. 3 illustrates the structure and mathematical operation of a MEMS resonator.
Figure 4:
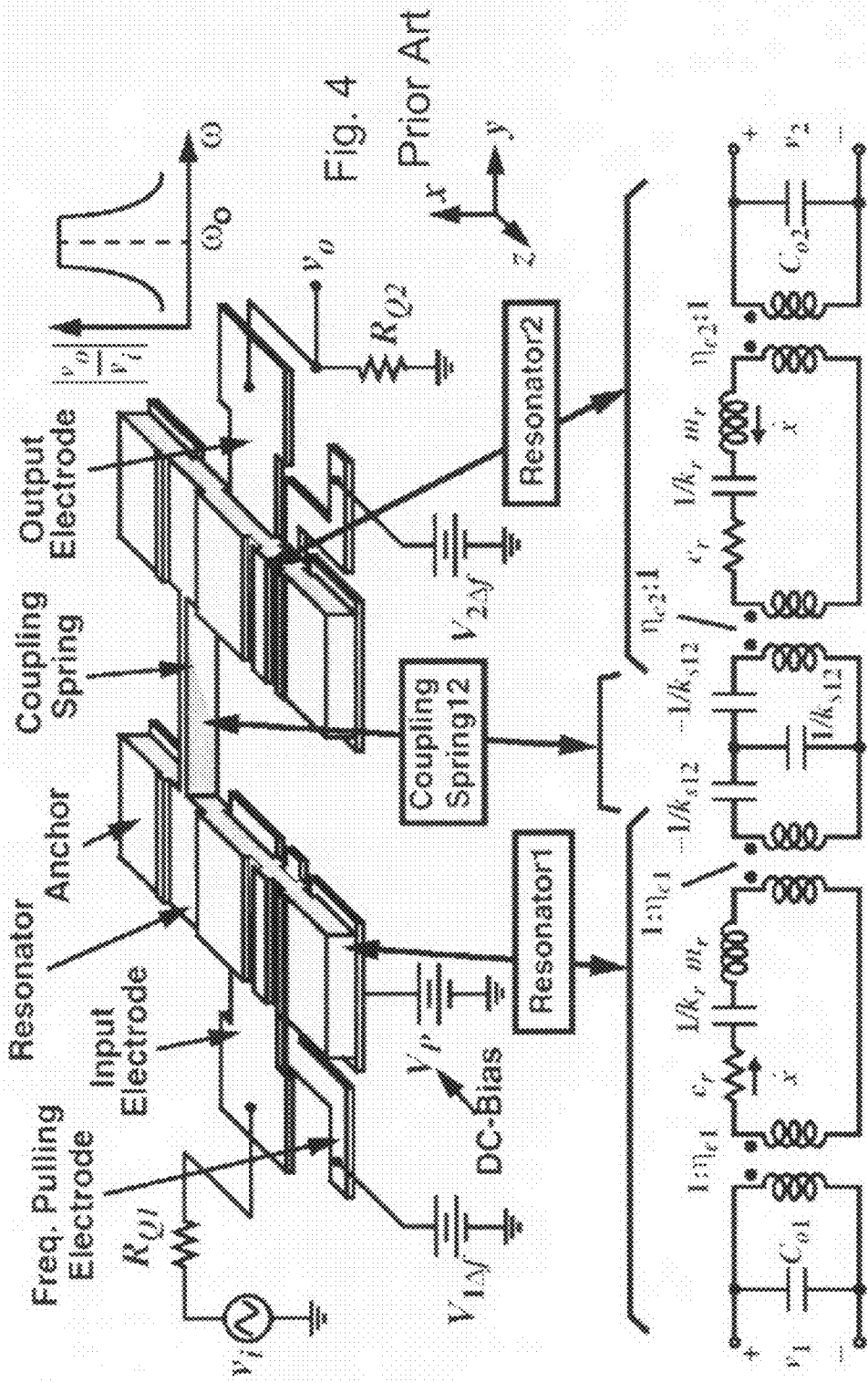
FIG. 4 illustrates a prior art interconnection of MEMS resonators.

Each MEMS resonator 608 of filter bank 604 has an associated switch 610 that connects the resonator to ground 612 through a capacitor 614. Switch 610 is shown in FIGS. 6 and 7 as a distinct component, but it may be part of the resonator 608 itself. Specifically, as shown in FIG. 3, a MEMS resonator requires a bias voltage; the presence of the bias voltage thus turns the MEMS resonator 608 ON, while the absence of the bias voltage thus turns the MEMS resonator 608 OFF. In the alternative, independent switches could be used. Non-limiting examples of such switches include solid state FET or CMOS switches.

When the switch 610 is open, the corresponding resonator 608 effectively presents an open circuit (either because the exterior switch is in fact an open circuit or because resonator 608 has a high impedance in the absence of a bias voltage as to effectively constitute an open circuit) between the incoming signal path 620 and ground 612. This particular resonator will therefore not filter out any signal on the signal path 620 at this frequency. When the frequency of the desired signal is known, the particular MEMS filter(s) with a partially or fully corresponding bandwidth can be turned OFF to allow the signal to pass without filtration.

Any remaining signals (presumably interference signals) in signal path 620 will be attenuated by the individual MEMS resonators 608 that are in an ON state. Specifically, all the resonators 608 in the MEMS bank 604 will have access to the received signal 100. If the signal 100 does not include any component at the resonance frequency range of a particular resonator 608, then that particular resonator will not respond to the signal; the high impedance of the resonator 608 acts as an open circuit to ground 612 (similar to when the resonator 608 is in the OFF state discussed above) and has no impact on the signal in the signal path.

However, if the signal includes any significant component at the resonance frequency range of a particular resonator 608, then that particular resonator 608 will resonate in response. At resonance, the impedance through the MEMS resonator 608 is at its lowest, thereby shunting that component of the input signal to ground 612. More specifically, input source impedance 602 and the low MEMS resonator's 608 impedance forms a voltage divider to attenuate the input signal at the resonating frequency. This will reduce the amplitude of the signal at that frequency, preferably to a level that is insufficient to either induce saturation in a downstream processor (not shown in FIG. 6 or 7) and/or to preserve the desired dynamic range of the processor to recover the weak desired signal. As discussed further below, a second MEMS bank 604 could also be used to further attenuate the noise signals.

In practice, there may be several signals of interest 102 as well as several nearby interfering signals 104. Such signals are processed as discussed above. Specifically, the resonators 608 that have resonator frequencies that overlap with the signals of interest are turned OFF so as not to affect those signals. The remaining resonators 608 are turned ON and will resonate in response to any signal in the corresponding frequency range. If multiple signals are present at different frequencies, then multiple resonators 608 will resonate simultaneously to individually attenuate the undesired signal components 104.

Figure 5:
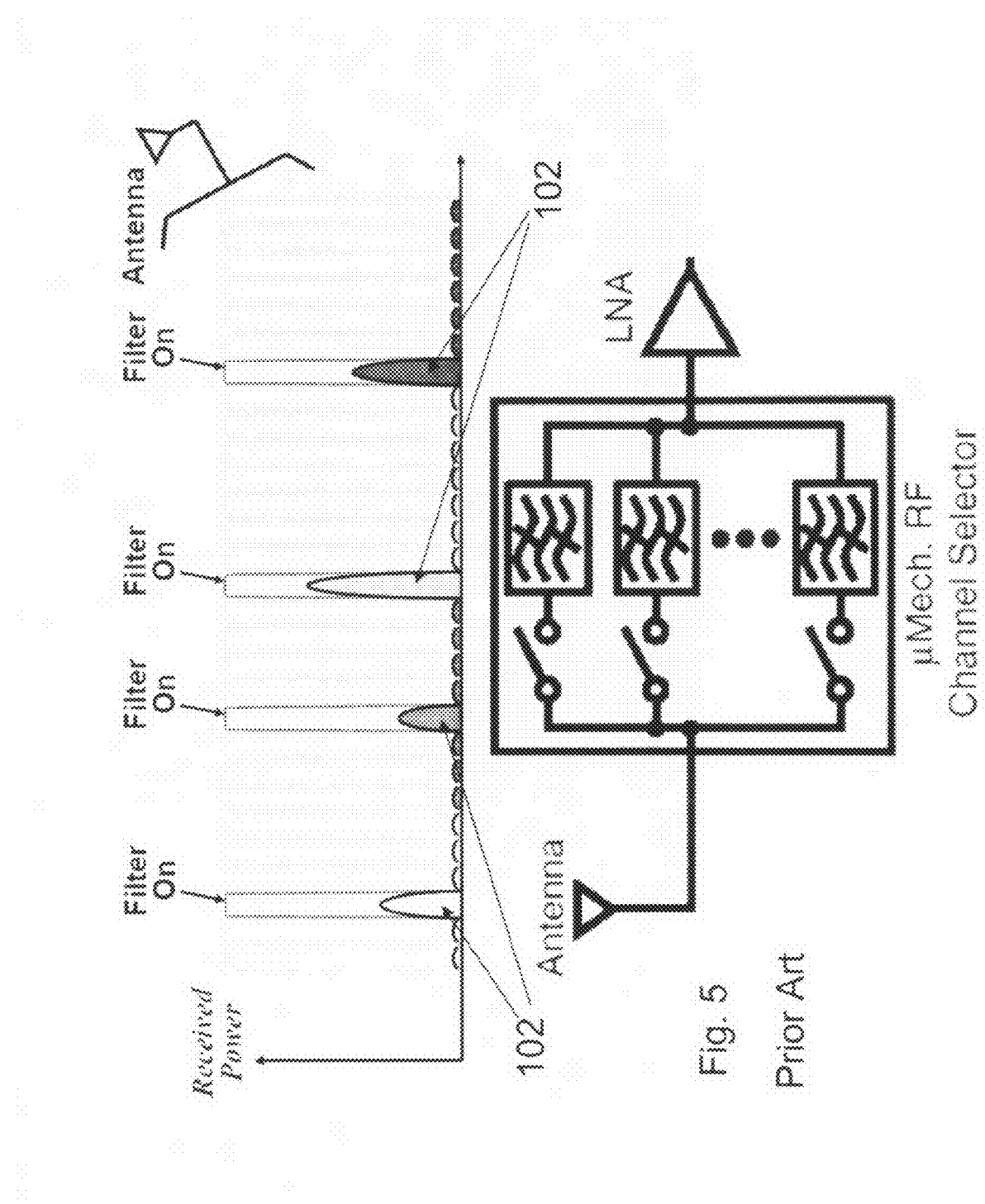
FIG. 5 illustrates a prior art arrangement for filtering the signal shown in FIG. 1
Figure 12:
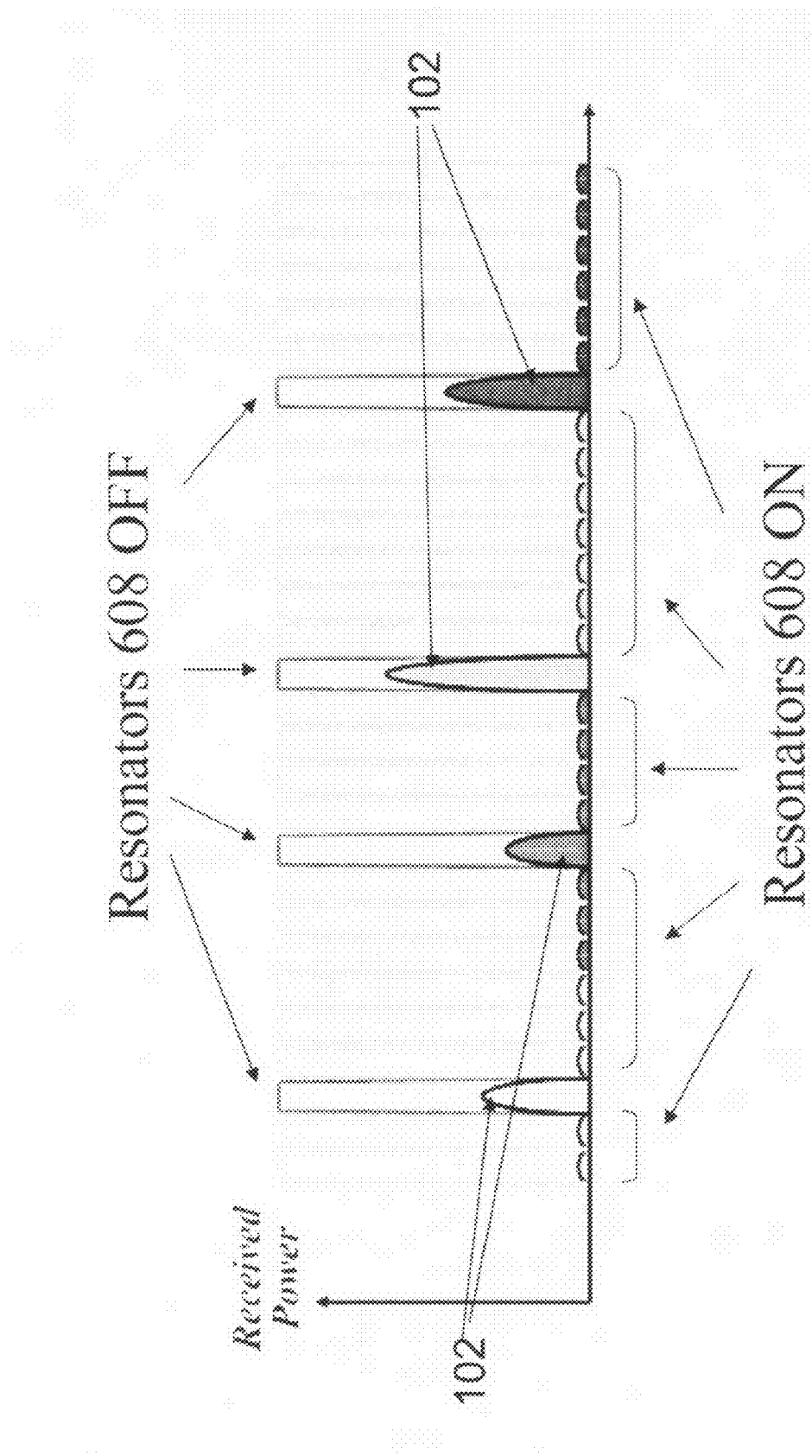
FIG. 12 shows how the signal of FIG. 1 can be processed according to an embodiment of the invention.

FIG. 12 shows a theoretical example of this application of the embodiment. FIG. 12 receives the same signal 100 as in FIG. 1, and similarly isolates the signals of interests as in FIG. 5. The primary difference in the output result of FIG. 12 according to the instant embodiment as opposed to the prior art of FIG. 5 is that the signals of interest 102 are not individually filtered, and thus the signals of interest can pass without distortion. As a result, MEMS resonators 108 do not have the design and precision constraints of the MEMS components utilized in the prior art configuration of FIG. 3 (which, as discussed above, are required to avoid distorting the signal of interest 102 during filtering).

The application also represents a different approach from that of the prior art, in that rather than trying to isolate desired signal 102 from signal 100, the noted embodiment instead cleaves away noise signals 104 from signal 100, such that only signal 100 remains.

While the above theoretical application provides some improvements over the prior art, it also has several of its disadvantages in that inherent variations in MEMS resonators would make it difficult to so precisely cleave undesired signal 104 from signal 100 to leave only signal 102. Such a perfect cleavage is also ultimately unnecessary, as the overall goal is to recover a desired weaker signal of interest 102 that is proximate to stronger interference signals 104; this does not require eradication of all interference signals 104, but rather a reduction in the strongest interference signals 104 from signal 100 such that the desired signal 102 can be successfully re recovered. Embodiments of the invention can achieve this effectively at both the structural and process level.

Figure 2:
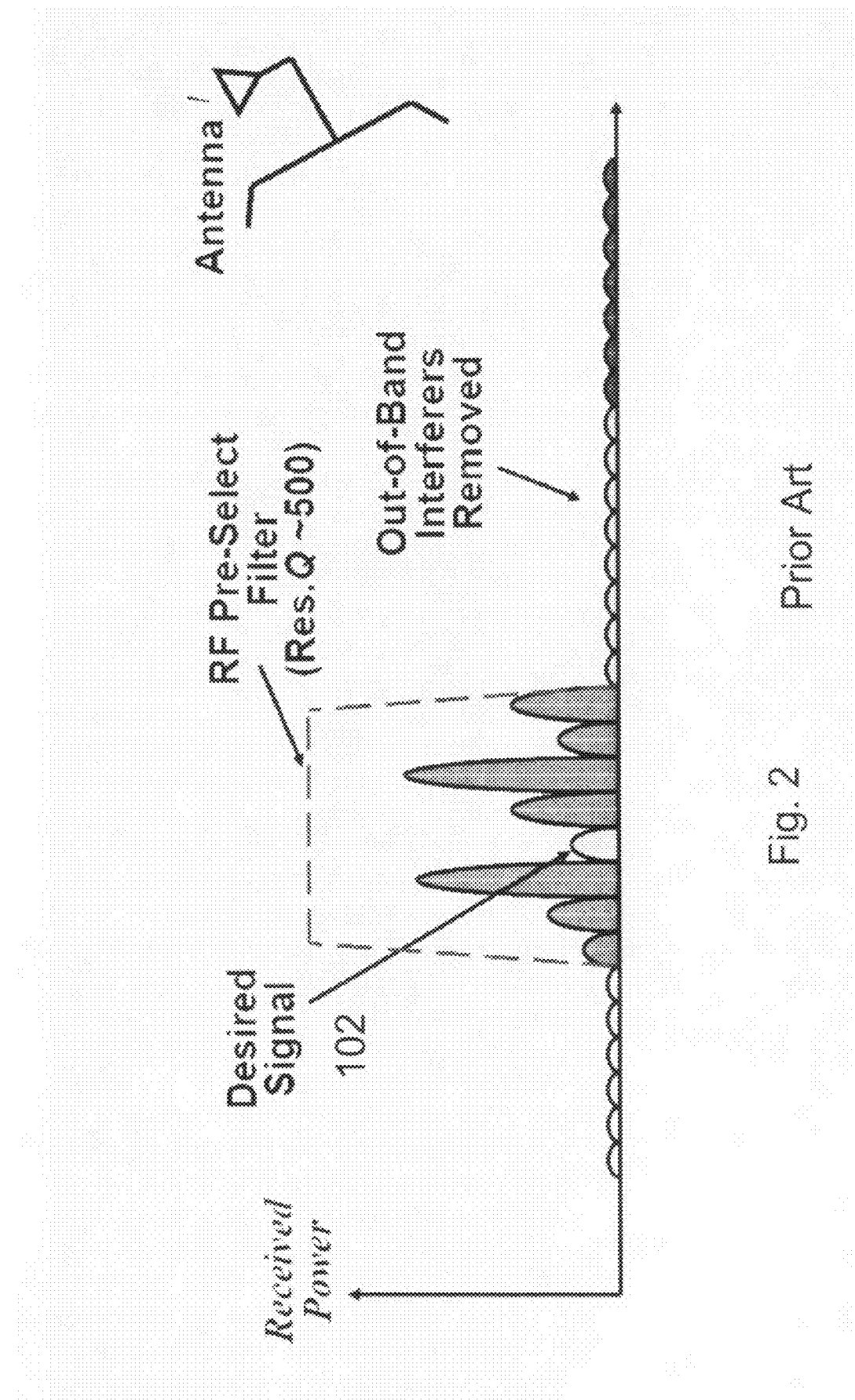
FIG. 2 illustrates the signal of FIG. 1 after processing by a band pass filter.

At a process level, consider again signal 100 in FIG. 13, which includes signal of interest 102 and interference signals 104. (For ease of reference, we refer only to the portion of signal 100 as shown in FIG. 2 following pre-processing). While all of the interference signals are undesirable, it is the stronger (high peaked) components 1202 of interferences signals 104 that can saturate the downstream processors and are primarily responsible for the difficulty in recovering the weaker signal of interest 102. Selective activation of MEMS resonators 608 in MEMS filter bank 604 for the frequency of the stronger components 1202 of the interference signals 104 only attenuates those specific stronger components 1202, resulting in the new signal 1400 in FIG. 14. While the overall interference signal 104 survives in part, the attenuation of the highest components make it more likely that the signal of interest 102 can be recovered. If it can, then no further processing is necessary. If it cannot, then the process can be applied iteratively to the remaining highest peak component(s) until the signal of interest 102 can be satisfactorily recovered.

The above approach provides several improvements relative to the prior art. For example, by way of analogy, it is much easier to identify loud voices in a room as opposed to soft voices; it is therefore much easier to identify and target the stronger components 1202 from signal 100 than it is for the prior art to identify and target the weaker signal of interest 102. In another example, the strong components 202 need not be isolated and removed with the same degree of precision as required to isolate the signal of interest 102. Either or both of these improvements allow the embodiments herein to be manufactured and controlled to less exacting standards than the environment described with respect to FIG. 5.

At the structural level, as discussed above, it is difficult to fine tune a MEMS resonator to a specific frequency due to variances in manufacturing accuracy, tolerances, operating conditions and age. An exemplary embodiment of the invention obviates this problem by setting the resonance frequency of individual MEMS resonators 608 to overlap with other resonators, such as shown in FIG. 8. The overlap allows for a degree of offset in the resonance frequencies while still maintaining collective coverage. FIG. 9 shows a non-limiting example of a drift relative to FIG. 8, in that the resonance frequency of the rightmost MEMS resonator 608 has shifted to the right, but the coverage remains the same. This degree of "play" afforded by the overlap makes the exact resonance frequency of each MEMS resonator less critical, which allows for a measure of flexibility in the precision of manufacture. The MEMS bank is also relatively immune to effects of age or temperature, as the collective coverage remains stable despite potential instability in the individual resonators.

Due to overtone modes, it is preferable that the collective coverage of any particular physical package of MEMS resonators 608 be maximized at an octave-wide band, plus or minus a percentage to account for frequency shifts (e.g., to cover a 1-2 Mhz octave in an environment with expected frequency shifts of 100 kHz, a group of resonators 608 that extended from 900 kHz to 2.1 Mhz would be preferred). Typically an octave wide band is sufficient to capture the signal of interest 102, although it may be necessary for filter bank 604 to be made up of a series of octave-wide sub-banks to provide a broader range of coverage.

Figure 10:
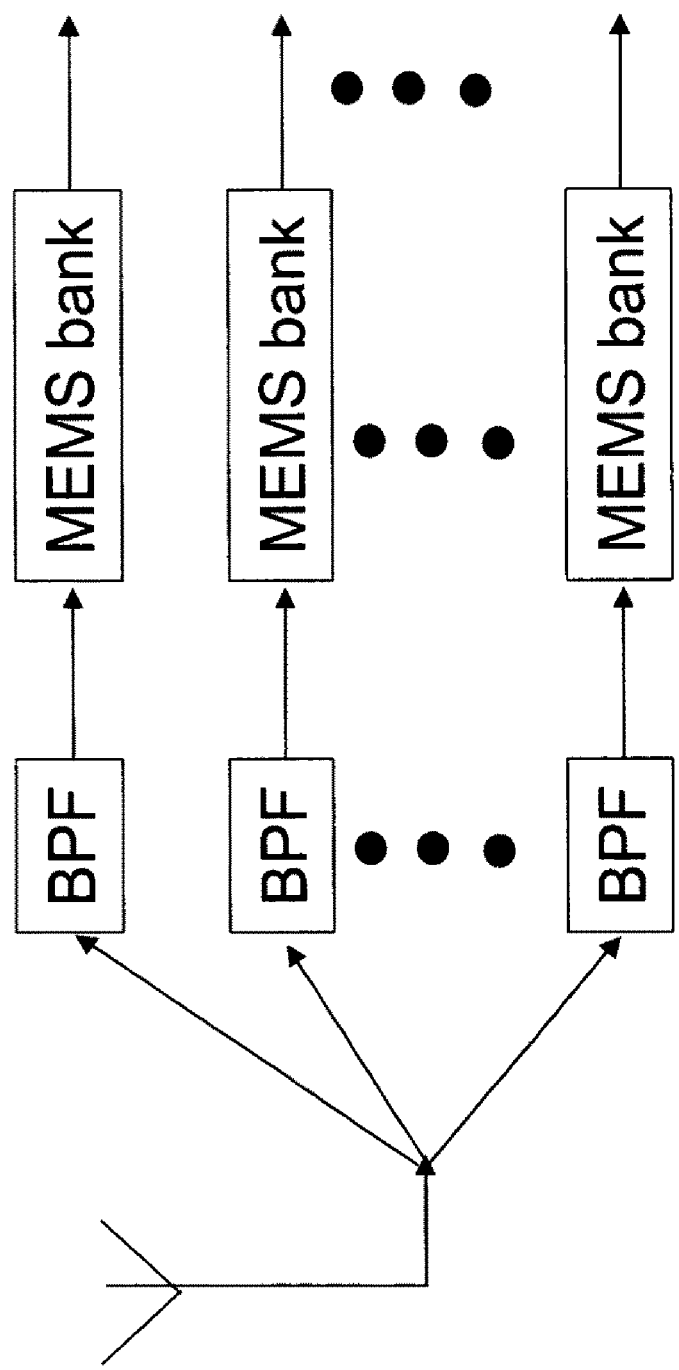
FIG. 10 shows an embodiment of the invention for iterative processing and signal selection.

The signals of interest 102 may be located within a range of frequencies which is a considerable distance from possible frequencies of other interferences. It may be impractical to provide MEMS resonators 608 to account for all of these possible frequencies. An alternative is to initially filter the raw signal via a wide-band pass filter to only pass the signals relevant to the particular MEMS bank 604, which filters the signals as shown in FIG. 2 relative to FIG. 1. The remaining signal, which is at the core frequencies of interest, is filtered through the MEMS bank 604 to remove interference signals within that core band. If there are desired signals in different octaves, then each can have its own combination of band pass filter and MEMS bank in parallel, such as shown in FIG. 10.

Figure 11:
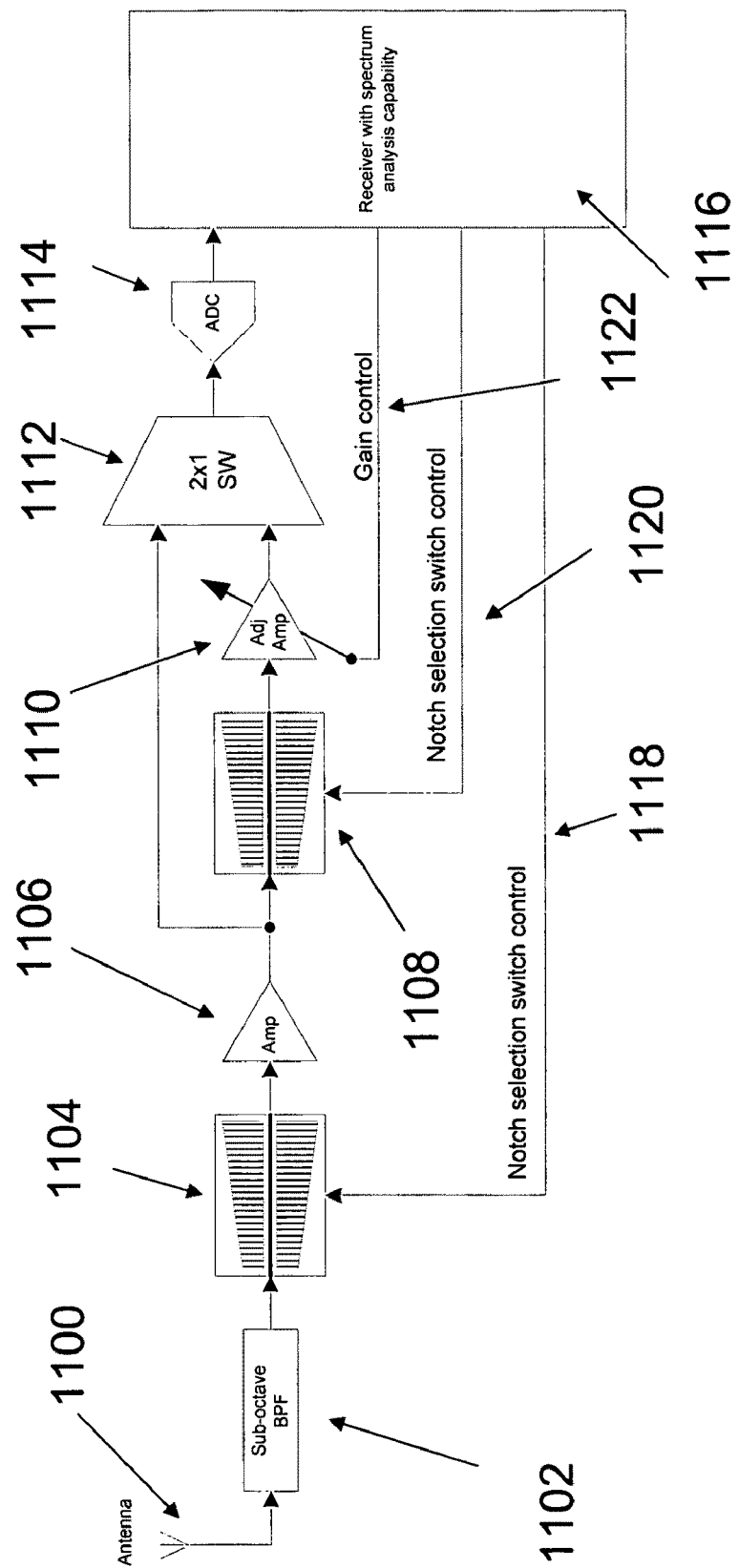
FIG. 11 shows a MEMS arrangement according to an embodiment of the invention.

FIG. 11 illustrates a MEMS notch filter bank that may be used in front of an analog-to-digital converter ("ADC") to preserve its dynamic range for the signal of interest. An ADC is typically the critical element within a receiver that limits the scope of dynamic range.

A raw signal is received by an antenna 1100 and forwarded to a sub-octave band pass filter 1102. Band filter 1102 determines the broad operating frequency octave range, and preferably matches the octave range of a subsequent first MEMS filter bank 1104. The output of MEMS filter bank 1104 is an input to switch 1112 for selective output to ADC 1114. The output of MEMS filter bank is also amplified by amplifier 1106 before filtering by a second MEMS filter bank 1108 and further amplified by adjustable amplifier 1110. The output of amplifier 1110 is the other input to switch 1112 for selective output to ADC 1114. The output of ADC 1114 passes to a receiver 1116 with spectrum analysis capability. Receiver 1116 in turn outputs notch control signals 1118 and 1120 for MEMS filter banks 1104 and 1108 (these signals will control the ON/OFF states of individual MEMS filters 608) and gain control signal 1122 to amplifier 1110.

Initially the individual resonator elements 608 within banks 1104 and 1008 are turned OFF, and adjustable amplifier 1110 is first set to its lowest gain setting so as not to saturate ADC 1114. The switch 1112 is set to select the output of first MEMS bank 1104, which is received and digitized by ADC 1114. Receiver 1116 analyzes the output of ADC 1114, through a spectrum analysis such as Fast Fournier transform. If the signal of interest 102 cannot be satisfactorily recovered, receiver 1116 will output a notch control signal 1118 to turn selective resonator elements 608 ON to reduce the interference level(s) by targeting the strongest interference components. This may be an iterative procedure to identify an optimal ON/OFF setting for MEMS filter bank 1104.

Once the MEMS filter bank 1104 is set, the circuit can attempt to obtain further improvement by passing the signal through the second MEMS filter bank 1108. Cascading of two MEMS notch filter bank (and potential more subsequent banks if desired) may provide higher attenuation, superior fault tolerance, and/or better overlap coverage. The procedure is the same as above, for the first filter bank 1008, although the gain of amplifier 1110 can be increased as the strong interference reduces to optimize the signal level of the desired signal. The specific MEMS resonators 608 within each filter bank 1008 and 1108 that are turned on may be the same or different. This may provide superior advantage of the limited dynamic range of the ADC.

The above embodiment may be modified to include additional MEMS filter banks to further attenuate the signal. In addition, the entire circuit downstream from antenna 1100 could be duplicated and attuned to different octave bands to provide multi-octave coverage.

Various claims herein recite the terms "before" and "after." Such terms indicate indirect or direct sequencing, such that there may be additional activity occurring between steps, including contingent steps.

It is known that MEMS arrays are sensitive to contamination. Air damping is a significant contributor to the energy loss. Vacuum packaging is desirable, preferably by wafer encapsulation techniques. The process begins with etching 0.4 μm trenches down to the glass insulation layer on 10 μm SOI wafers to form resonator structures. In operation, these resonators will vibrate horizontally to the surface of the wafer. The trenches are covered with glass and the wafers are put into an epitaxial reactor to grow a thin layer of silicon over the surface. Vents are etched in this layer through which some of the glass is removed to release the resonator. The wafers are again placed in an epitaxial reactor and cleaned at over 1000° C. to burn off contaminants, the vents are sealed shut, and thick silicon caps are grown. The high temperature anneals the resonators, removes micro-cracks, pits, and scallops, and leaves the MEMS resonators permanently sealed within extremely clean vacuum cavities. The thick silicon caps are mechanically stable and withstand the high pressure of plastic package molding. After polishing, the wafers appear new and unprocessed despite containing tens of thousands of resonators hidden below their surfaces. Vias are then cut through the cap silicon to form electric contacts to the resonator's drive and sense electrodes.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method for recovering at least one signal of interest, comprising:
   receiving an overall signal, the overall signal including the at least one signal of interest and a plurality of other signals;
   identifying at least one of the strongest components of the plurality of other signals;
   attenuating, using at least one MEMS resonator, any of the components identified by said identifying, wherein the overall signal will be modified to include the at least one signal of interest, attenuated versions of the components identified by said identifying, and the remaining portions of the plurality of other signals that were not subject to the attenuating; and
   recovering, after the attenuating, the at least one signal of interest.

2. The method of claim 1, further comprising:
   determining, after the receiving, whether the at least one signal of interest is recoverable from the overall signal without requiring attenuation of at least one of the strongest components of the plurality of other signals; and
   wherein said identifying, attenuating, and recovering are all contingent upon a negative result of said determining.

3. The method of claim 1, further comprising:
   augmenting the modified overall signal after said attenuating and before said recovering.

4. The method of claim 1, wherein the at least one MEMS resonator includes a plurality of MEMS resonators, each configured to resonate at a different frequency range, said attenuating further comprising:
   resonating each individual MEMS resonator with a frequency range overlapping with the at least one of the strongest components, thereby providing a shunt to ground.

5. The method of claim 1, wherein the at least one signal of interest is substantially unaffected by said attenuating.

6. The method of claim 1, wherein the at least one signal of interest is not subject to any filtering by said attenuating.

7. The method of claim 1, further comprising:
   receiving a master signal;
   passing said master signal through a band pass filter; and
   wherein the overall signal is the output of the band pass filter.

8. The method of claim 1, wherein said recovering comprises selecting the at least one signal of interest from either the overall signal or the modified overall signal.

9. The method of claim 1, further comprising:
   iteratively applying said identifying and attenuating to thereby produce a plurality of modified signals; and
   said recovering comprising selecting the at least one signal of interest from one of the overall signal or the plurality of modified overall signals.

10. The method of claim 1, wherein the at least one MEMS resonator includes a plurality of MEMS resonators in a MEMS filter bank, the method further comprising:
    generating, in response to the identifying, control signals for said MEMS filter bank, the control signals being configured to selectively activate individual MEMS resonators that have frequency ranges that at least partially overlap with the identified strong components; and
said attenuating comprising resonating the individual MEMS resonators under control of the control signals to shunt the strong components to ground.

11. A method for recovering at least one signal of interest, comprising:
receiving an overall signal, the overall signal including a signal of interest component and an interference component;
identifying dominant portions of the interference component;
processing the overall signal to produce a processed overall signal, said processing comprising attenuating the dominant portions of the interference component using a MEMS filter bank without any significant attenuation of the signal component or the non-dominant portions of the interference component; and
attempting to recover the signal of interest component from the processed overall signal.

12. The method of claim 11, further comprising:
determining, after the receiving, whether the signal of interest component is recoverable from the overall signal without requiring attenuation of the dominant portions of the interference component; and
wherein said identifying, processing and attempting are all contingent upon a negative result of said determining.

13. The method of claim 11, further comprising:
augmenting the processed overall signal after said processing and before said attempting.

14. The method of claim 11, wherein the MEMS filter bank includes a plurality of MEMS resonators, each configured to resonate at a different frequency range, said processing further comprising:
resonating each individual MEMS resonator with a frequency range overlapping with the dominant portions, thereby providing a shunt to ground.

15. The method of claim 11, wherein the signal of interest component is substantially unaffected by said processing.

16. The method of claim 11, wherein the signal of interest component is not subject to any filtering by said processing.

17. The method of claim 11, further comprising:
receiving a master signal;
passing said master signal through a band pass filter; and
wherein the overall signal is the output of the band pass filter.

18. The method of claim 11, wherein said attempting comprises selecting the signal of interest component from either the overall signal or the processed overall signal.

19. The method of claim 11, further comprising:
iteratively applying said identifying and processing to thereby produce a plurality of processed overall signals; and
said attempting comprising selecting the one signal of interest component from one of the overall signal or the plurality of processed overall signals.

20. The method of claim 11, further comprising:
generating, in response to the identifying, control signals for the MEMS filter bank, the controls signals being configured to selectively activate individual MEMS resonators that have frequency ranges that at least partially overlap with the identified dominant portion; and
said processing comprising resonating the individual MEMS resonators under control of the control signals to shunt the dominant portions to ground.

21. An apparatus for reducing interference in an incoming signal traveling along a signal pathway, comprising:
a bank of MEMS resonators, each of said resonators having an ON and OFF state;
each of said resonators having an individual resonance frequency range collectively defining a frequency range of the bank;
an electrode having a first end connected to the signal path, and a body connected to each of said MEMS resonators; and
each of the MEMS resonators having a pathway to ground;
wherein each individual resonator within the bank responds to the signal as follows:
when the individual resonator is ON and the signal includes a component at a frequency that falls within the individual resonance frequency range of the particular resonator, the individual resonator will resonate in response to the signal and at least partially shunt the component to ground, thereby attenuating that component of the signal with substantially no impact on portions of the signal at frequencies outside the individual frequency range; and
when the individual resonator is OFF, or when the individual resonator is ON and the signal does not include a component at a frequency that falls within the individual resonance frequency range of the particular resonator, the individual resonator will have substantially no impact on the signal;
wherein the bank of MEMS resonators is configured to attenuate portions of the signal while having substantially no impact on the remainder of the signal.

22. The apparatus of claim 21, further comprising the individual resonance frequency range of each MEMS resonator substantially overlapping with at least one other MEMS resonator.

23. The apparatus of claim 21, wherein each MEMS resonator in said bank of MEMS resonators has a different length.

24. The apparatus of claim 21, further comprising a controller configured to:
analyze the signal at a point downstream of the signal pathway;
determine which individual MEMS resonators within said bank to turn ON and OFF; and issue corresponding ON or OFF signals to the bank.

25. An apparatus for reducing interference in an incoming signal traveling along a signal pathway, comprising:
a plurality of banks of MEMS resonators;
a plurality of amplifiers, each located downstream of a respective bank of MEMS resonators;
the output of each amplifier being connected to an available downstream one of the plurality of banks of MEMS resonators, to thereby iteratively process the signal;
a controller configured to receive the signal and the output of each amplifier, the controller being configured to issue control signals to individual MEMS resonators within the plurality of banks of MEMS resonators, and to thereby attenuate interference components in the incoming signal; and
wherein a signal of interest will be recoverable from either the incoming signal or the output of at least one of the amplifiers.

26. The apparatus of claim 25, wherein each individual bank of MEMS resonators within the plurality of banks further comprises:
each individual resonators with said bank having an ON and OFF state;

each of said individual MEMS resonators having an individual resonance frequency range collectively defining a frequency range of the bank;

an electrode having a first end connected to the signal path, and a body connected to each of said individual MEMS resonators; and each of the individual MEMS resonators having a pathway to ground;

wherein each individual resonator within the bank responds to the signal as follows:

when the individual resonator is ON and the signal includes a component at a frequency that falls within the individual resonance frequency range of the particular resonator, the individual resonator will resonate in response to the signal and at least partially shunt the component to ground, thereby attenuating that component of the signal with substantially no impact on portions of the signal at frequencies outside the individual frequency range; and when the individual resonator is OFF, or when the individual resonator is ON and the signal does not include a component at a frequency that falls within the individual resonance frequency range of the particular resonator, the individual resonator will have substantially no impact on the signal;

wherein the bank of MEMS resonators is configured to attenuate portions of the signal while having substantially no impact on the remainder of the signal.

* * * * *